(12) United States Patent
Murayama

(10) Patent No.: US 6,321,291 B1
(45) Date of Patent: Nov. 20, 2001

(54) METHOD OF MEASURING THE SPEED OF A MEMORY UNIT IN AN INTEGRATED CIRCUIT

(75) Inventor: Tohru Murayama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/585,837

(22) Filed: Jun. 1, 2000

Related U.S. Application Data

(62) Division of application No. 08/911,935, filed on Aug. 15, 1997, now Pat. No. 6,115,783.

(30) Foreign Application Priority Data

Aug. 15, 1996 (JP) ..................................................... 8-233621

(51) Int. Cl.⁷ ..................................................... G06F 12/00
(52) U.S. Cl. ............................ 711/100; 711/219; 714/719
(58) Field of Search ................... 711/217–219, 100–167; 365/201–230.04; 714/718–720

(56) References Cited

U.S. PATENT DOCUMENTS

| | | |
|---|---|---|
| 3,805,152 | 4/1974 | Ebersman et al. . |
| 4,949,242 | 8/1990 | Takeuchi et al. . |
| 5,018,145 | 5/1991 | Kikuchi et al. . |
| 5,636,225 | 6/1997 | Osawa . |
| 5,704,035 | 12/1997 | Shipman . |
| 5,892,776 | 4/1999 | Kumakura . |
| 5,910,181 | 6/1999 | Hatakenaka et al. . |

FOREIGN PATENT DOCUMENTS

| | | |
|---|---|---|
| 48-26036 | 4/1973 | (JP) . |
| 62-120698 | 6/1987 | (JP) . |
| 64-25400 | 1/1989 | (JP) . |
| 3-30200 | 2/1991 | (JP) . |
| 4-274100 | 9/1992 | (JP) . |
| 9-91995 | 4/1997 | (JP) . |

*Primary Examiner*—Do Hyun Yoo
*Assistant Examiner*—Nasser Moazzami
(74) *Attorney, Agent, or Firm*—Scully, Scott, Murphy & Presser

(57) ABSTRACT

In order to precisely measure the speed of memory unit, the memory unit stores at least one bit data at a predetermined bit position at each memory word such that the logical value of the one bit data changes alternately in order of memory address. An address increment circuit, which is provided in a module including the memory unit, successively generates memory addresses which are applied to the memory. The address increment circuit increments a memory address in response to the output of the memory. The memory speed between two consecutive memory outputs is detected by measuring a pulse width of a pulse signal outputted from the memory unit. Thus, a relatively large delay otherwise caused at a buffer amplifier can effectively be compensated.

18 Claims, 6 Drawing Sheets

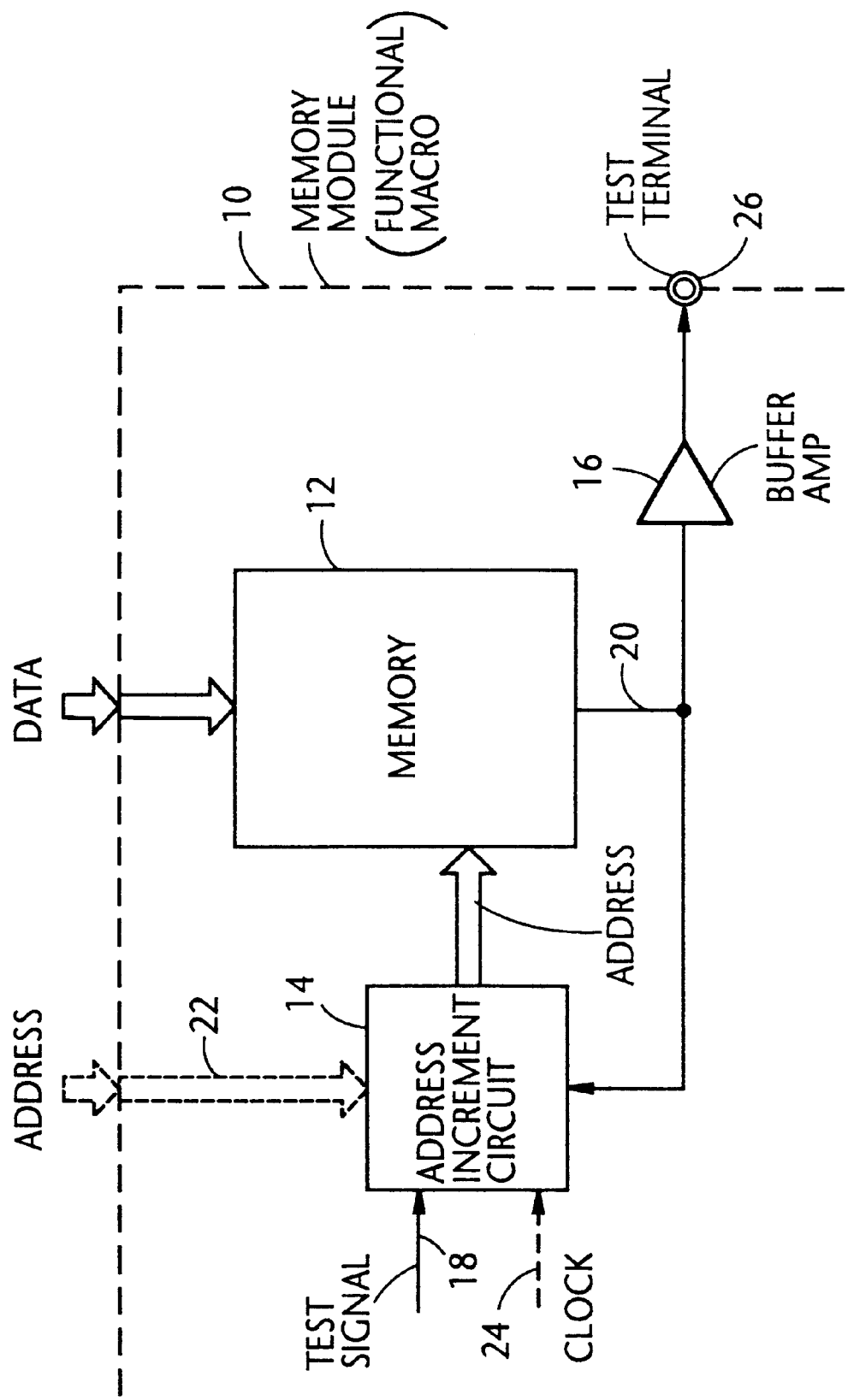

FIG. 2A

| MEMORY ADDRESS | DATA |
|---|---|
| 0 0 0 H | 1 1 1 ... 1 1 |
| 0 0 1 H | 0 0 0 ... 0 0 |
| 0 0 2 H | 1 1 1 ... 1 1 |
| 0 0 3 H | 0 0 0 ... 0 0 |
| 0 0 4 H | 1 1 1 ... 1 1 |
| • | • |
| • | • |
| • | • |

FIG. 2B

| MEMORY ADDRESS | DATA |
|---|---|
| 0 0 0 H | * * 1 ... * * |
| 0 0 1 H | * * 0 ... * * |
| 0 0 2 H | * * 1 ... * * |
| 0 0 3 H | * * 0 ... * * |
| 0 0 4 H | * * 1 ... * * |
| • | • |
| • | • |
| • | • |

METHOD OF MEASURING THE SPEED OF A MEMORY UNIT IN AN INTEGRATED CIRCUIT

CROSS-REFERENCE TO RELATED APPLICATIONS

This application is a Divisional Application of application Ser. No. 08/911,935 filed Aug. 15, 1997 U.S. Pat. No. 6,111,783.

BACKGROUND OF THE INVENTION

1. Field of the Invention

The present invention relates generally to techniques for measuring the speed of memory unit in an integrated circuit (IC), and more specifically to a built-in hardware arrangement for measuring a time interval between two consecutive outputs of the memory unit.

2. Description of the Related Art

As is known in the art, it is very important to precisely determine the speed of memory unit that is provided in an IC. A useful measure of the speed of memory unit is the time that elapses between the initiation of an operation and the completion of that operation. This is referred to as the memory access time. Another important measure is the memory cycle time, which is the minimum time delay required between the initiation of two successive memory operations.

One known technique of measuring the speed of IC memory is to successively apply memory addresses from external and detect each memory output. An IC tester is used to measure the time delay between the application of each address and the detection of the data derived from the memory. As is known, a buffer amplifier is provided between the memory and the output pins. This buffer amplifier unit inherently provides a relatively large amount of delay before the data is derived from the memory unit via the IC output pins. Thus, with the above mentioned method, it is very difficult to accurately measure the speed of memory unit.

Another approach to measuring the memory speed is to provide a memory speed measuring unit within an IC memory itself. One example of such techniques is disclosed in Japanese Laid-open Patent Application No. 4-274100. According to this conventional technique, a plurality of delay elements are incorporated in an IC memory module to determine a memory access time. However, this technique detects a memory access time at a time interval which is determined by the delay elements and accordingly, it is not expected to precisely determine the speed of memory unit.

SUMMARY OF THE INVENTION

It is, therefore, an object of the present invention to provide a hardware arrangement that is built in a memory module and is able to accurately measure the speed of memory.

Another object of the present invention is to provide a method of accurately measuring the speed of memory using a built-in measuring hardware. In brief, these objects are achieved by a technique wherein in order to precisely measure the speed of memory unit, the memory unit stores at least one bit data at a predetermined bit position at each memory word. That is, the logical value of the one bit data changes alternately in order of memory address. An address increment circuit, which is provided in a module including the memory unit, successively generates memory addresses which are applied to the memory. The address increment circuit increments a memory address in response to the output of the memory. The memory speed between two consecutive memory outputs is detected by measuring a pulse width of a pulse signal outputted from the memory unit. Thus, a relatively large delay otherwise caused at a buffer amplifier can effectively be compensated.

BRIEF DESCRIPTION OF THE DRAWINGS

The features and advantages of the present invention will become more clearly appreciated from the following description taken in conjunction with the accompanying drawings in which like elements are denoted by like reference numerals and in which:

FIG. 1 is a block diagram showing a general arrangement of a first embodiment of the present invention;

FIG. 2A and 2B are each a table showing memory addresses and data stored thereat;

DETAILED DESCRIPTION OF THE PREFERRED EMBODIMENTS

Reference is now made to FIG. 1, wherein a first embodiment of the present invention is generally illustrated in block diagram form. It is to be noted that FIG. 1 shows only an arrangement that is directly concerned with the memory speed measurement according to the present invention. Accordingly, a various terminals of a memory array, which are used in a normal operation and well known in the art, are not shown for the sake of simplifying the disclosure.

The arrangement of FIG. 1 will be described together with FIGS. 2A, 2B and 3. As shown in FIG. 1, a memory module (or functional memory macro) 10 includes an asynchronous type memory (or memory array) 12, an address increment circuit 14, and a buffer amplifier 16. The memory 12 takes the form of RAM (random access memory), ROM (read only memory), etc. When the speed of the memory 12 is to be measured, two kinds of data (viz., all "1"s and all "0"s) are alternately stored in the storage words of the memory 12 in order of memory addresses, as shown in FIG. 2A. The data writing of all "1"s and all "0" is implemented in a manner known to those skilled in the art. In FIG. 2A, an alphabet H attached to each memory address indicates that the address is represented in hexadecimal notation. The memory word length itself is not concerned with the present invention.

Figure 3:
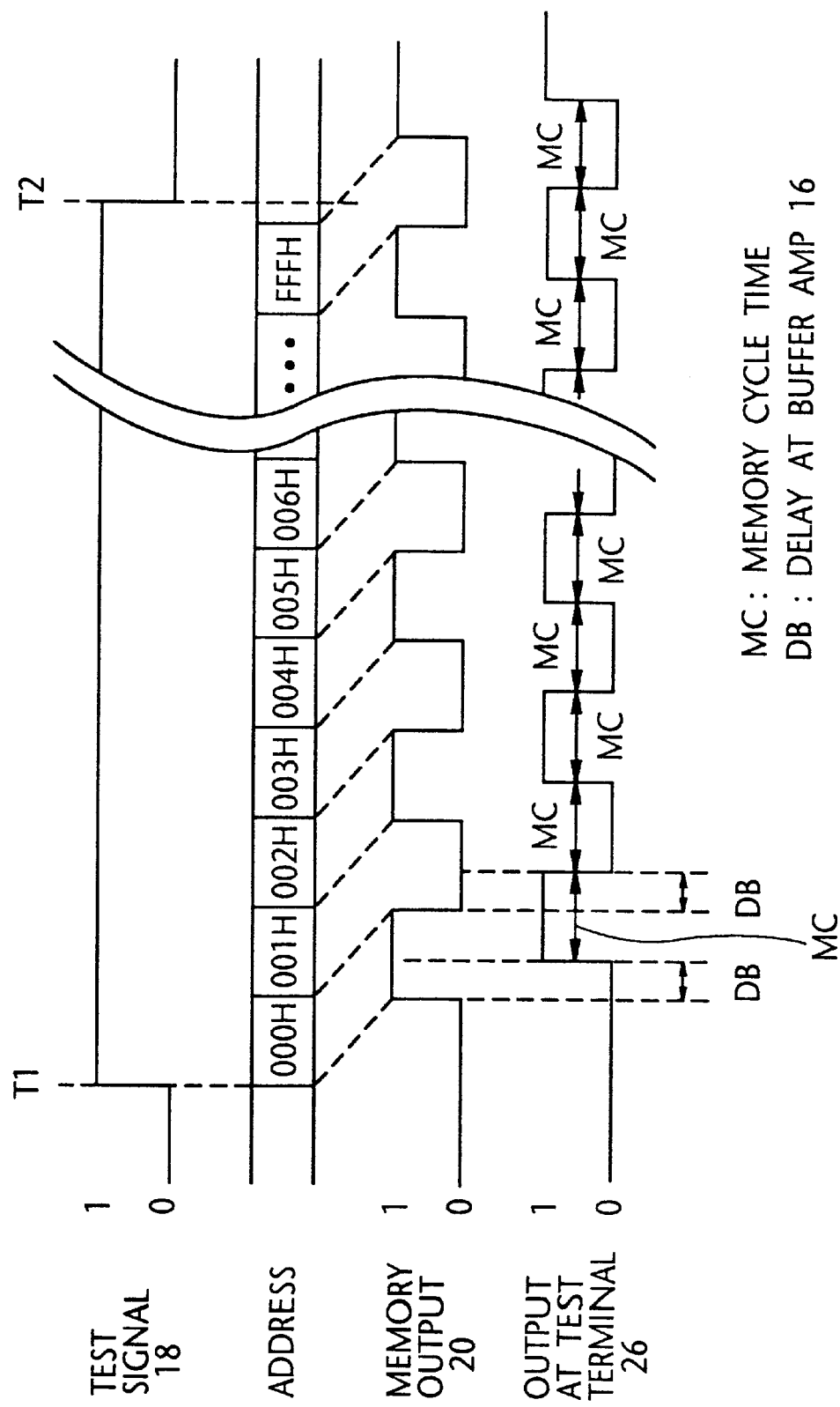
FIG. 3 is a timing diagram for use in describing the operation of the arrangement of FIG. 1.

In order to initiate the memory speed measurement, a test signal 18 is applied to the address incrementing circuit 14 at a time point T1 (FIG. 3). The test signal 18 sets the circuit 14 such as to select an output 20 of the memory array 12 in place of an address bus 22 and a clock line 24. In order to clearly indicate that the address bus 22 and the clock line 24 are not used in the memory speed measurement, they are shown by broken lines. Thereafter, the address increment circuit 14 applies the first address "000H" to the memory 12, which outputs all "1" data at the data output terminals of the memory 12. One bit data among the whole data issued from the memory 12 is applied to the address incrementing circuit 14 and also to the buffer amplifier 16. Since the data outputted from the memory array 12 exhibits all "1"s or all "0"s, the aforesaid one bit data is arbitrarily selected when designing the memory speed measuring arrangement shown in FIG. 1.

The operation of the arrangement of FIG. 1 is further described with reference to FIG. 3. The circuit 14 of FIG. 1, in response to the bit data indicating "1" fed thereto from the memory 12, applies the next memory address "001H" to the memory 12. Thus, the circuit 14 in turn receives a bit data indicating, "0", in response to which the circuit 14 applies the next memory address "002H" to the memory 12. These operations are repeated until the test signal 18 is terminated as at a time point T2 (FIG. 3).

As mentioned above, the memory bit data is also applied to the buffer amplifier 16, the output of which is delayed thereat and appears at a test terminal 26. The data at the terminal 26 assumes alternately a high and low logic levels (viz., "1" and "0"), as shown in the bottom row of FIG. 3. This pulse signal appearing at the test terminal 16 is then applied to a suitable test equipment (not shown), which measures the pulse width which corresponds to a memory cycle time (denoted by MC). In the instant disclosure, the memory cycle time implies a time interval between two consecutive memory outputs. It is understood that the delay at the buffer amplifier 16 is effectively canceled by measuring the pulse width.

Figure 4:
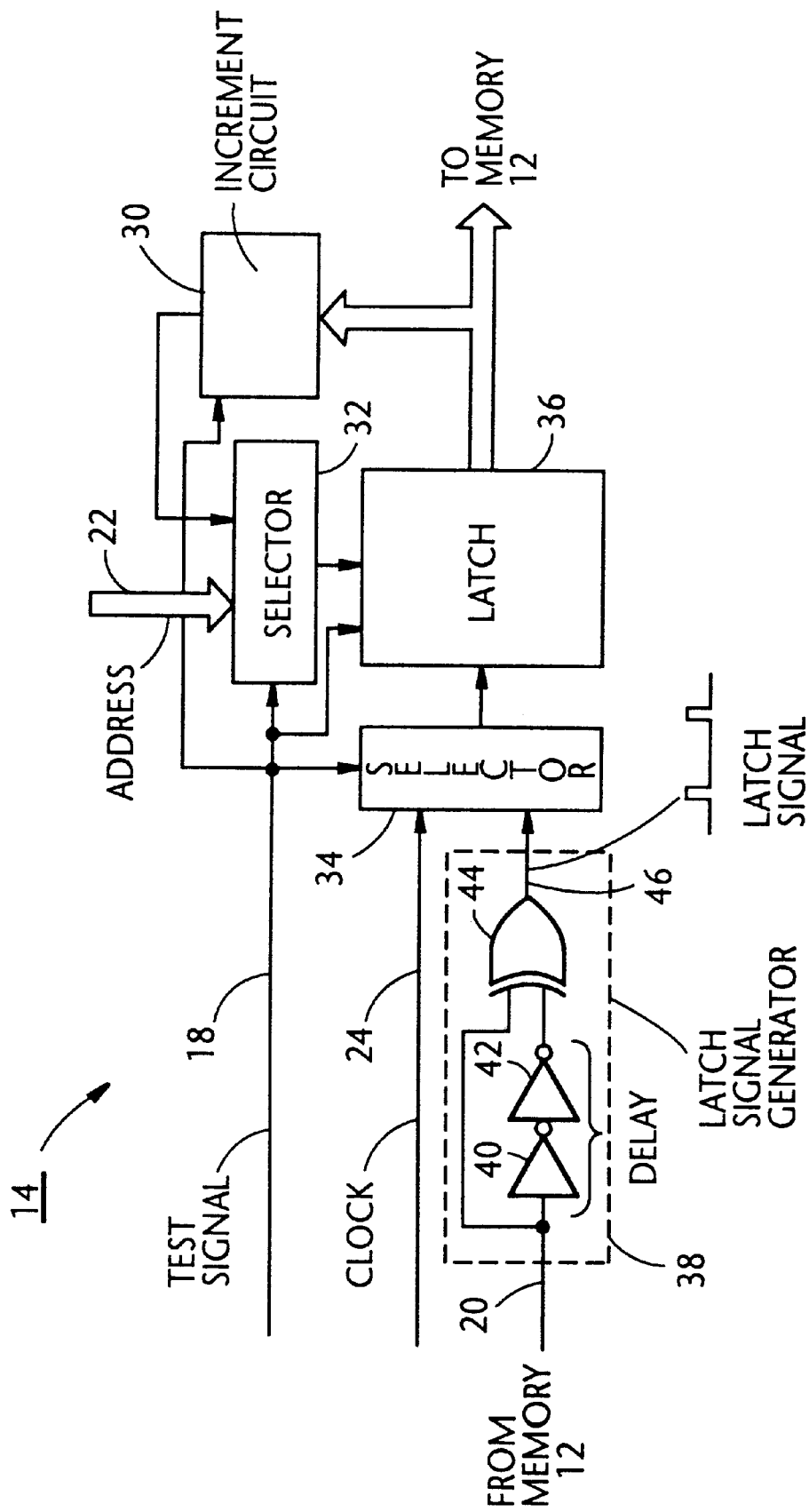
FIG. 4 is a block diagram showing a detail of a block of FIG. 1.

FIG. 4 is a block diagram showing a detail of the address increment circuit 14 of FIG. 1. As shown in FIG. 4, the arrangement comprises an increment circuit 30, two selectors 32 and 34, a latch 36, and a latch signal generator 38. Further, the generator 38 includes two inverters 40 and 42, and an exclusive-or gate 44.

When the speed of the memory 12 (FIG. 1) is to be measured, the test signal 18 is applied to the address increment circuit 14 of FIG. 4. The selector 32, in response to the test signal 18 that assumes a high logic level, continues to select an output of the increment circuit 30 instead of the external address signal via the address bus 22. Likewise, the other selector 34 responds to the test signal 18 (assuming the high logic level) and selects the output of the latch signal generator 38 in place of the clock 24. When the test signal 18 assumes the high logic level, the increment circuit 30 is reset and issues the first address signal "000H". The latch 36 responds to the test signal 18 assuming the high logic level and latches the first address "000H", which is thus applied to the memory 12. Further, the increment circuit 30 responds to the issuance of the address signal from the latch 36 and increments the address to "001H" in the instant stage.

Thereafter, the bit data "1" outputted from the memory 12 is applied to the latch signal generator 8. It is assumed that the latch signal generator 38 is initially supplied with a logic level "0". The serially coupled inverters 40 and 42 serve as a delay circuit. Accordingly, when the input to the generator 8 changes from "0" to "1", a pulse is generated from the exclusive-OR gate 44 and has a very narrow pulse width. Likewise, when the input to the generator 38 changes from "1" to "0", the same pulse mentioned above is also generated from the gate 44. The output of the gate 44 is referred to as a latch signal 46. Summing up, as the bit data 20 changes from "1" to "0" or vise versa, a pulse having a narrow width is generated as indicated in FIG. 4. Each pulse width of the latch signal 46, which is determined by the delay provided by the two inverters 40 and 42, has a very small value and may be negligible in the measurement of memory speed.

The latch 36 responds to the rising edge of the latch signal 46 and latches the next address "001H", which is applied to the memory 12. As mentioned above, the increment circuit 30 responds to the newly latched address and increments the content thereof to "002H" in the instant case. These operations are iterated until the test signal 18 is terminated (viz., assumes a low logic level).

In the above description, all "1" and all "0" data are alternately stored in the memory addresses starting with the first address "00H". However, it is possible to alternately all "0" and all "1" data from the first address "00H". In this case, an inverter is added before the latch signal generator 38, while another inverter is added before the buffer amplifier 16.

In the first embodiment, only one bit data is required from the memory 12. Therefore, there is no need for storing all "1" and all "0" data in the memory words. That is to say, as shown in FIG. 2B, it is sufficient to alternately store "1" and "0" bit data at a predetermined bit position of each memory word. In FIG. 2B, an asterisk indicates that the bit data may take any logic value (viz., "1" or "0").

Figure 5:
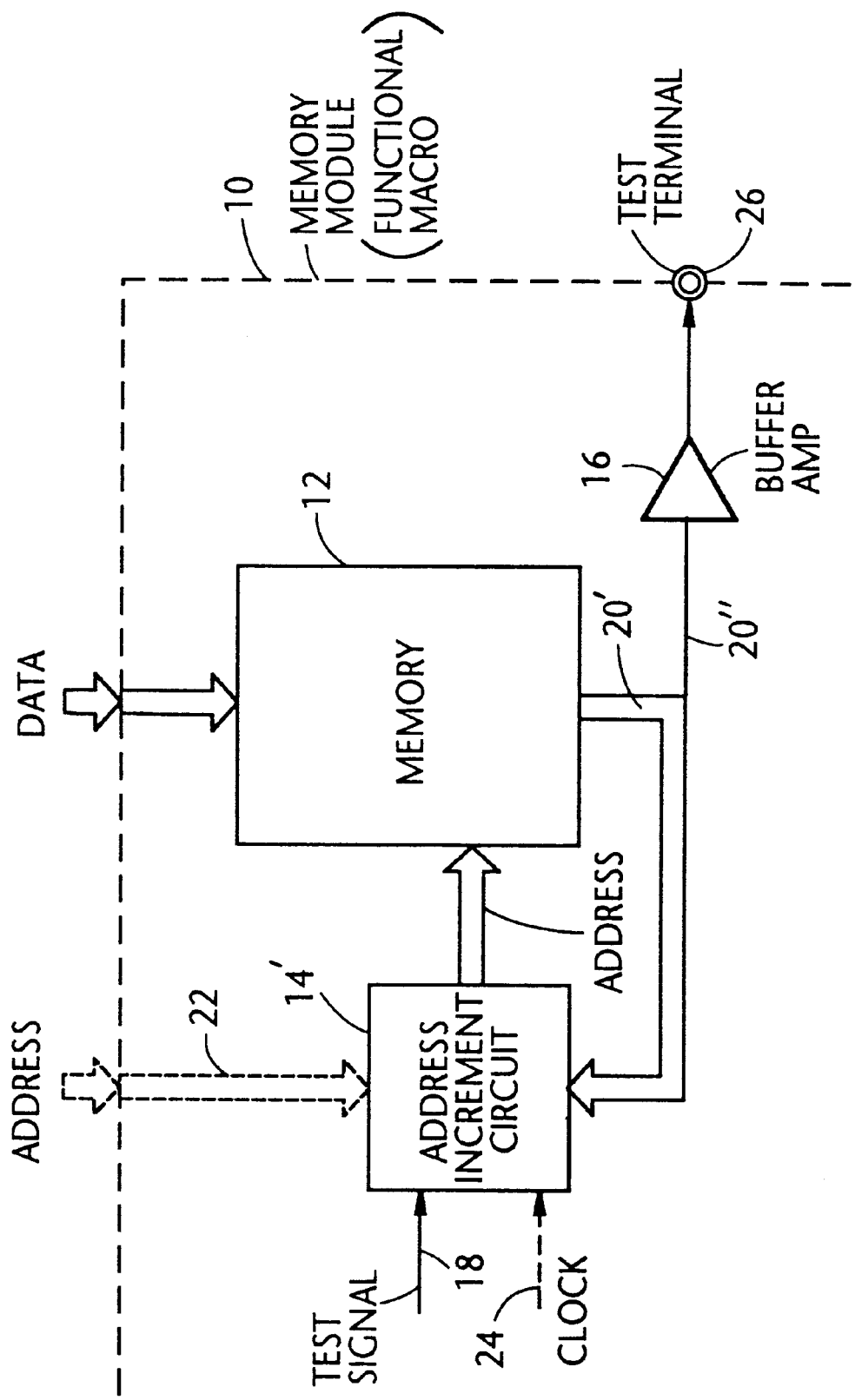
FIG. 5 is a block diagram showing a general arrangement of a second embodiment of the present invention.
Figure 6:
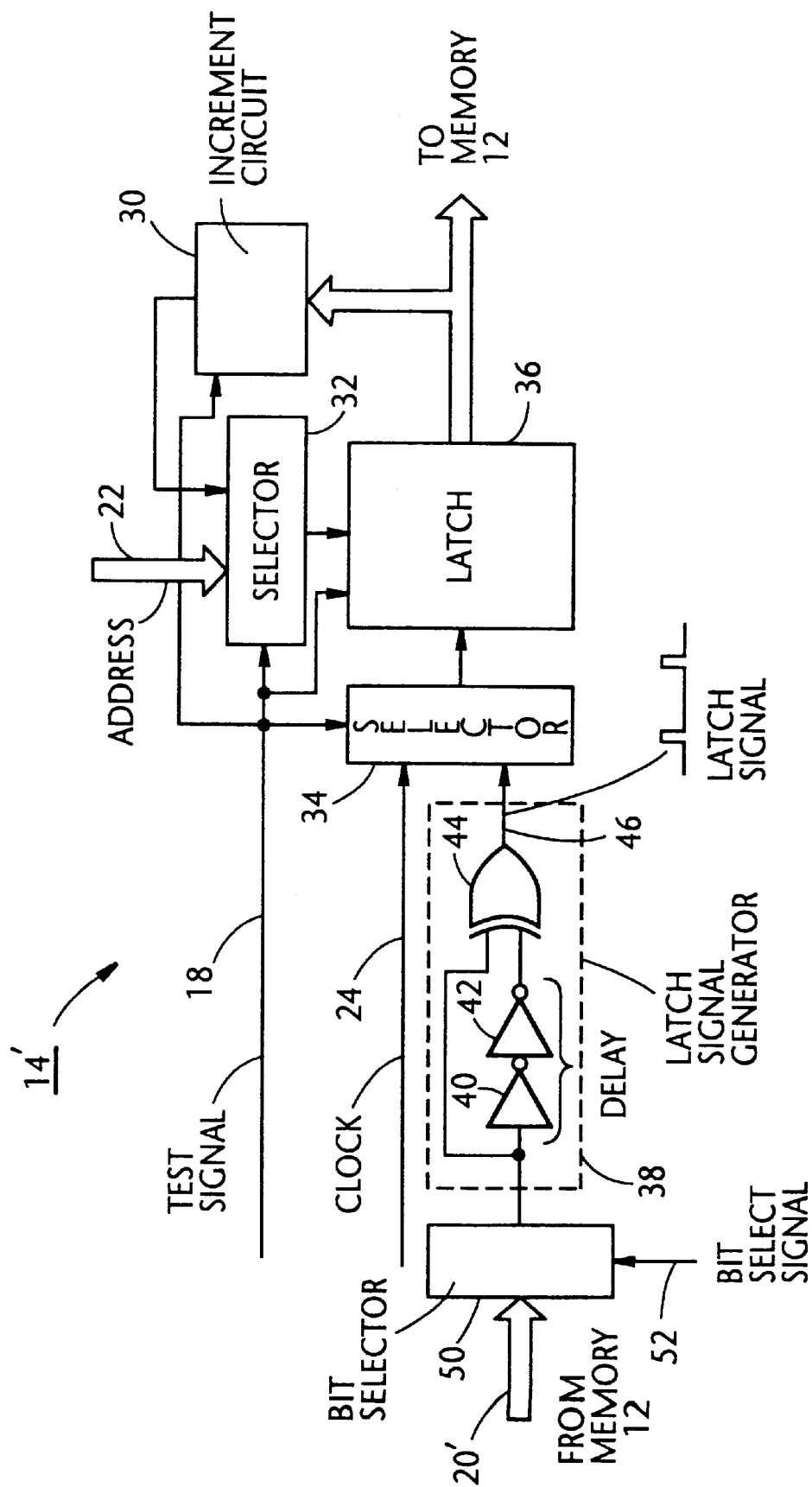
FIG. 6 is a block diagram showing a detail of a block of FIG. 5.

A second embodiment of the present invention is described with reference to FIGS. 5 and 6.

The second embodiment differs from the first one in that the former embodiment is provided with an address increment circuit 14' that receives a plurality of bit signals (denoted by 20') from the memory 12 and then selects one bit signal among them. The buffer amplifier 16 receives one bit signal (denoted by 20") among the bit signals 20'. Other than this, the second embodiment is identical to the first embodiment. FIG. 6 shows a detail of the address increment circuit 14'. As shown, there is provided a bit selector 50 in front of the latch signal generator 38. The bit selector 50 is supplied with the output 20' of the memory 12 and select one bit using a bit select signal 52. The remaining portions of FIG. 6 are identical to those of FIG. 4 and thus, further description thereof will be omitted for brevity.

It will be understood that the above disclosure is representative of only two possible embodiments of the present invention and that the concept on which the invention is based is not specifically limited thereto.

What is claimed is:

1. A method of measuring the speed of a memory unit in a memory module, comprising the steps of:

a. storing in the memory unit a plurality of consecutive memory words, wherein each memory word stores at least one bit data at a predetermined bit position, and wherein the logical value of the at least one bit data changes alternately between a zero and a one in consecutive memory words stored in the memory unit in order of memory address; and b. activating an address increment circuit to generate a memory address, applying the generated memory address to the memory unit, incrementing the memory address in response to the at least one bit data read out from the memory unit, such that consecutive words are read out from the memory unit, and each consecutive word causes the address increment circuit to increment the memory address.

2. A method of measuring the speed of a memory unit as claimed in claim 1, further comprising forming the memory module as an integrated circuit.

3. A method of measuring the speed of a memory unit as claimed in claim 1, further comprising providing a buffer amplifier in the memory module between the output of the memory unit and a memory module output, which buffer amplifier provides an inherent delay before data read out from the memory unit is available at the memory module output.

4. A method of measuring the speed of a memory unit as claimed in claim 3, further comprising detecting the time between two consecutive outputs of the memory unit by measuring the pulsewidth of a pulse signal outputted from the memory unit, such that the delay at the buffer amplifier is effectively canceled by measuring the pulsewidth.

5. A method of measuring the speed of a memory unit as claimed in claim 4, further comprising outputting an output signal at the memory module output which assumes alternately high and low logic levels, and the measured pulsewidth corresponds to a memory cycle time.

6. A method of measuring the speed of a memory unit as claimed in claim 1, further comprising inputting into the memory module inputs from an address bus and a clock line, to read data from the memory unit, and initiating a measurement of the speed of the memory unit by applying a test signal to the address increment circuit at a first time point, to set the address increment circuit to select an output of the memory unit in place of the address bus and the clock line, such that the address bus and the clock line are not used in the memory speed measurement, and thereafter activating the address increment circuit to apply a first address to the memory unit, and in response to a first word read out from the first address of the memory unit, activating the address increment circuit to apply the next memory address to the memory unit, and repeating this operation until the test signal is terminated at a second time point.

7. A method of measuring the speed of a memory unit as claimed in claim 6, further including forming the address increment circuit with an increment circuit, first and second selectors, a latch, and a latch signal generator, and measuring the speed of the memory unit by applying a test signal to the address increment circuit, causing the first selector to select an output of the increment circuit in place of the external address signal via the address bus, and causing the second selector to select the output of the latch signal generator in place of the clock.

8. A method as claimed in claim 1, further comprising providing an amplifier coupled to receive the at least one bit data of each of said memory words, and applying an output of said amplifier to an output terminal of the memory module.

9. A method of operating a logic circuit, comprising:
   storing in a memory a plurality of memory words, each of which includes a bit data, at a predetermined bit position, which bit data takes a value which changes alternately in order of memory address;
   activating an address increment circuit to successively generate memory addresses, applying the successively generated memory addresses to the memory, and activating the address increment circuit to increment the memory address in response to said bit data derived from said memory; and
   coupling an amplifier to receive said bit data, applying an output of the amplifier to an output terminal of a module including the logic circuit.

10. A method of operating a logic circuit as claimed in claim 9, said address increment circuit further comprising the steps of:
    receiving said bit data outputted from said memory and generating an address incrementing signal whose logic value changes each time said bit data changes the logic value thereof; and
    generating, in response to said address incrementing signal, a memory address that is applied to said memory.

11. A method of operating a logic circuit as claimed in claim 10, said address increment circuit further comprising the steps of:
    in response to said address incrementing signal, latching a memory address that is applied to said memory; and
    incrementing a memory address, and in response to the memory address which has been latched, applying the latched memory address to said memory.

12. A method of operating a logic circuit as claimed in claim 9, wherein all bit data of each of said memory words takes alternately one of said two logic values in order of memory addresses.

13. A method of operating a logic circuit as claimed in claim 12, said address increment circuit further comprising the steps of:
    receiving said all bit data of each of said memory words and selecting and issuing using a bit selector, said bit data at said predetermined bit position,
    receiving said bit data outputted from said bit selector and generating an address incrementing signal whose logic value changes each time said bit data changes the logic value thereof; and
    generating, in response to said address incrementing signal, a memory address that is applied to said memory.

14. A method of operating a logic circuit as claimed in claim 13, said address increment circuit firther comprising the steps of:
    in response to said address incrementing signal, latching a memory address that is applied to said memory; and
    incrementing a memory address, and in response to the memory address which has been latched, applying the latched memory address to said memory.

15. A method of measuring the speed of a memory, comprising the steps of:
    (a) storing data in said memory such that each of a plurality of memory words in said memory includes a bit data, at a predetermined bit position, which alternatively assumes one of two logic values in successive order of memory addresses;
    (b) accessing said memory in successive order of memory addresses by incrementing said memory address in response to an output of said memory at said predetermined bit position; and
    (c) measuring a time interval between two consecutive outputs of said memory.

16. A method as claimed in claim 15, wherein all bit data of each of said memory words take alternately one of said two logic values in successive order of memory addresses.

17. A method as claimed in claim 15, wherein step (b) comprising the steps of:
    receiving said bit data outputted from said memory;
    generating an address incrementing signal that changes the logic value thereof each time said bit data changes the logic value thereof; and
    generating, in response to said address incrementing signal, a memory address that is applied to said memory.

18. A method as claimed in claim 17, wherein all bit data of each of said memory words takes alternately one of said two logic values in order of memory addresses.

* * * * *